United States Patent
Ahn

(10) Patent No.: US 6,294,455 B1
(45) Date of Patent: *Sep. 25, 2001

(54) CONDUCTIVE LINES, COAXIAL LINES, INTEGRATED CIRCUITRY, AND METHODS OF FORMING CONDUCTIVE LINES, COAXIAL LINES, AND INTEGRATED CIRCUITRY

(75) Inventor: Kie Y. Ahn, Chappaqua, NY (US)

(73) Assignee: Micron Technology, Inc., Boise, ID (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/917,003

(22) Filed: Aug. 20, 1997

(51) Int. Cl.[7] ................................................. H01L 21/4763
(52) U.S. Cl. ........................ 438/619; 438/627; 438/637; 438/666; 438/780
(58) Field of Search ................................. 257/758, 759, 257/735, 773, 776; 438/622, 624, 638, 631, 628, 618, 627, 637, 619, 780, 666; 29/828; 174/102 R

(56) References Cited

U.S. PATENT DOCUMENTS

| 3,982,268 | 9/1976 | Anthony et al. | 357/55 |
| 4,394,712 | 7/1983 | Anthony | 361/411 |
| 4,419,150 | 12/1983 | Soclof | 148/187 |

(List continued on next page.)

FOREIGN PATENT DOCUMENTS

| 4-133472 | 5/1992 | (JP) | 257/621 |

OTHER PUBLICATIONS

Taylor et al., "Polymers for high performance interconnects", Materials for Advanced Metallization, Mar. 1997, pp. 59–63.*
U.S. Patent Application Serial No. 08/917,449, filed Aug. 22, 1997, Geusic et al.
U.S. Patent Application Serial No. 08/917,443, filed Aug. 22, 1997, Ahn.
U.S. Patent Application Serial No. 09/095,774, filed Jun. 10, 1998, Ahn.
U.S. Patent Application Serial No. 09/118,346, filed Jul. 17, 1998, Geusic et al.
V. Lehman, "The Physics of Macropore Formation in Low Doped N–Type Silicon," *J. Electrochem. Soc.*, vol. 140, No. 10, Oct. 1993, pp. 2836–2843.

(List continued on next page.)

*Primary Examiner*—Olik Chaudhuri
*Assistant Examiner*—Kurt Eaton
(74) *Attorney, Agent, or Firm*—Wells, St. John, Roberts, Gregory & Matkin P.S.

(57) ABSTRACT

Conductive lines, such as co-axial lines, integrated circuitry incorporating such conductive lines, and methods of forming the same are described. In one aspect, a substrate having an outer surface is provided. A masking material is formed over the outer surface and subsequently patterned to form a conductive line pattern. An inner conductive layer is formed within the conductive line pattern, followed by formation of a dielectric layer thereover and an outer conductive layer over the dielectric layer. Preferred implementations include forming the inner conductive layer through electroplating, or alternatively, electroless plating techniques. Other preferred implementations include forming the dielectric layer from suitable polymer materials having desired dielectric properties. A vapor-deposited dielectric layer of Parylene is one such preferred dielectric material.

38 Claims, 6 Drawing Sheets

U.S. PATENT DOCUMENTS

| | | | | |
|---|---|---|---|---|
| 4,440,973 | * | 4/1984 | Hawkins | 174/107 |
| 4,595,428 | | 6/1986 | Anthony et al. | 148/187 |
| 4,610,077 | | 9/1986 | Minahan et al. | 29/572 |
| 4,776,087 | * | 10/1988 | Cronin et al. | 29/828 |
| 4,870,470 | | 9/1989 | Bass, Jr. et al. | 357/23.5 |
| 4,933,743 | | 6/1990 | Thomas | 357/71 |
| 4,939,568 | | 7/1990 | Kato et al. | 357/75 |
| 4,977,439 | | 12/1990 | Esquivel et al. | 357/49 |
| 5,148,260 | * | 9/1992 | Inoue et al. | 357/67 |
| 5,166,097 | | 11/1992 | Tanielian | 437/203 |
| 5,312,765 | | 5/1994 | Kanber | 437/22 |
| 5,317,197 | | 5/1994 | Roberts | 257/401 |
| 5,424,245 | | 6/1995 | Gurtler et al. | 437/183 |
| 5,426,072 | | 6/1995 | Finnila | 437/208 |
| 5,482,873 | | 1/1996 | Yang | 437/31 |
| 5,539,227 | * | 7/1996 | Nakano | 257/276 |
| 5,539,256 | * | 7/1996 | Mikagi | 257/63 |
| 5,587,119 | | 12/1996 | White | 264/104 |
| 5,596,230 | * | 1/1997 | Hong | 257/758 |
| 5,599,744 | | 2/1997 | Koh et al. | 437/195 |
| 5,608,237 | | 3/1997 | Aizawa et al. | 257/132 |
| 5,614,743 | | 3/1997 | Mochizuki | 257/276 |
| 5,618,752 | | 4/1997 | Gaul | 438/626 |
| 5,635,423 | * | 6/1997 | Huang et al. | 438/637 |
| 5,640,049 | | 6/1997 | Rostoker et al. | 257/758 |
| 5,646,067 | | 7/1997 | Gaul | 438/180 |
| 5,651,855 | * | 7/1997 | Dennison et al. | 156/636.1 |
| 5,661,344 | | 8/1997 | Havemann et al. | 257/758 |
| 5,682,062 | | 10/1997 | Gaul | 257/686 |
| 5,698,867 | | 12/1997 | Bauer et al. | 257/138 |
| 5,699,291 | | 12/1997 | Tsunemine | 365/149 |
| 5,717,247 | | 2/1998 | Koh et al. | 257/686 |
| 5,750,436 | | 5/1998 | Yamaga et al. | 438/558 |
| 5,753,529 | | 5/1998 | Chang et al. | 437/67 |
| 5,767,001 | | 6/1998 | Bertagnolli et al. | 438/455 |
| 5,807,783 | | 9/1998 | Gaul et al. | 438/406 |
| 5,811,868 | | 9/1998 | Bertin et al. | 257/516 |
| 5,817,572 | * | 10/1998 | Chiang et al. | 438/624 |
| 5,827,775 | * | 10/1998 | Miles et al. | 438/622 |
| 5,841,197 | | 11/1998 | Adamic, Jr. | 257/777 |
| 5,852,320 | | 12/1998 | Ichihashi | 257/419 |
| 5,858,877 | * | 1/1999 | Dennison et al. | 438/700 |
| 5,869,893 | | 2/1999 | Koseki et al. | 257/723 |
| 5,930,625 | | 7/1999 | Lin et al. | 438/253 |
| 5,933,758 | * | 8/1999 | Jain | 438/687 |
| 5,990,562 | | 11/1999 | Vallett | 257/774 |
| 6,001,538 | | 12/1999 | Chen et al. | 430/316 |
| 6,037,244 | * | 3/2000 | Gardner et al. | 438/586 |
| 6,037,248 | * | 3/2000 | Ahn | 438/619 |

OTHER PUBLICATIONS

K.P. Mueller et al., "Trench Storage Node Technology for Gigabit DRAM Generations," *Technical Digest of International Electron Devices Meeting*, Dec. 8–11, 1996, pp. 507–510.

H. Horie et al., "Novel High Aspect Ratio Plug for Logic/DRAM LSIs Using Polysilicon–Aluminum Substitute (PAS)," *Technical Digest of International Electron Devices Meeting*, Dec. 8–11, 1996, pp. 946–948.

M. Thomas et al., "VLSI Multilevel Micro–Coaxial Interconnects for High Speed Devices," *Fairchild Research Center*, IEEE, 1990, pp. 3.5.1–3.5.

T. Ohba, et al., "Evaluation on Selective Deposition of CVD W Films by Measurement of Surface Temperature," Tungsten and Other Refractory Metals for VLSI Applications II, Proceedings of 1986 Workshop, pp. 59–66, 1987 by Materials Research Society.

R.F. Foster et al., "High Rate Low–Temperature Selective Tungsten," ibid, 1988 workshop, pp. 69–72, 1988.

T. Ohba et al., "Selective Chemical Deposition of Tungsten Using Silane and Polysilane Reductions," ibid, workshop, pp. 17–25, 1989.

Guttman et al., "Low and High Dielectric Constant Thin Films for Integrated Circuit Applications", Extended Abstract, presented to the Advanced Metallization and Interconnect Systems for VLSI Applications in 1996, Oct. 3–5, 1996, Boston, MA.

* cited by examiner

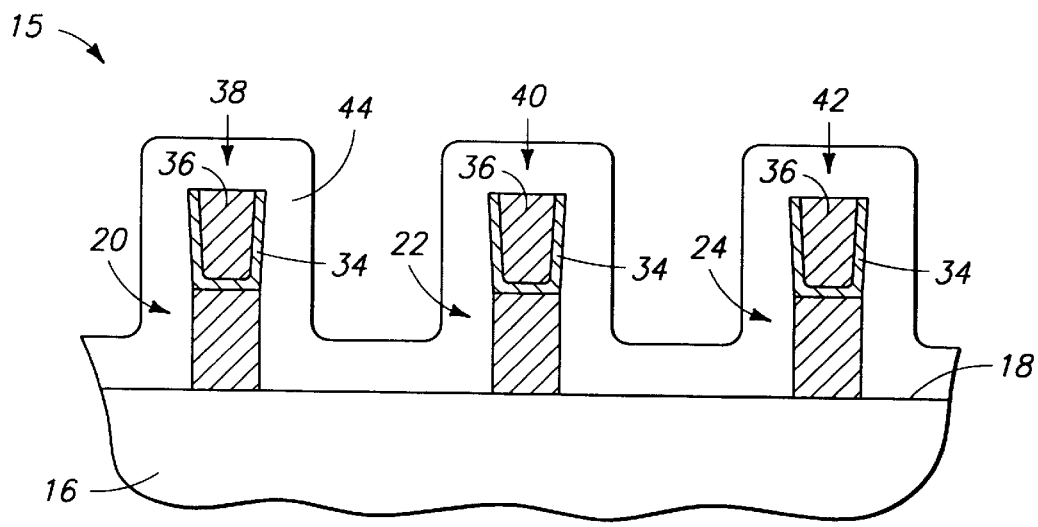
$\not\equiv \bot \sqsubseteq \neg \bot \varpi$
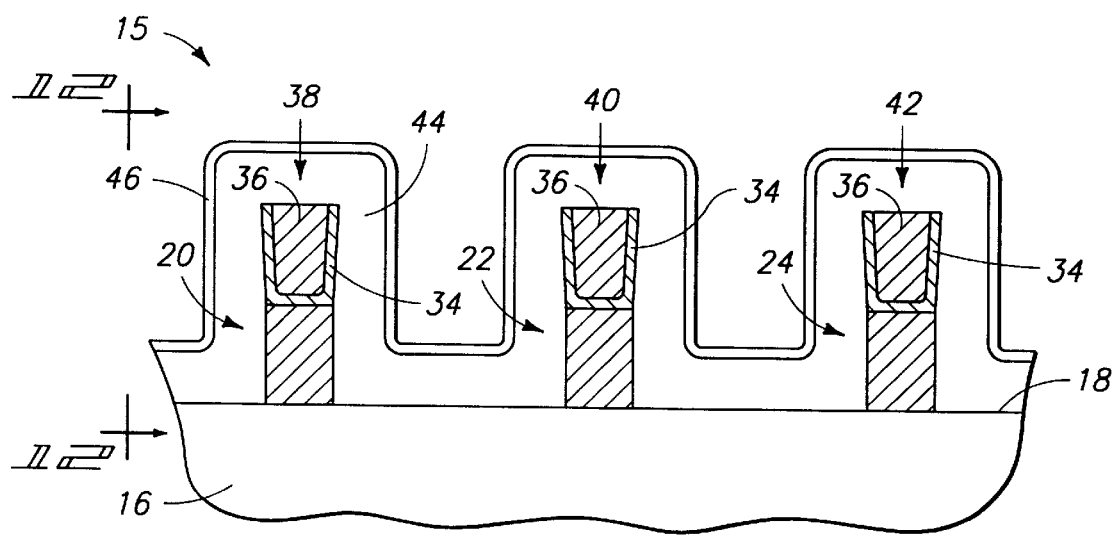
$\not\equiv \bot \sqsubseteq \neg \bot \bot$

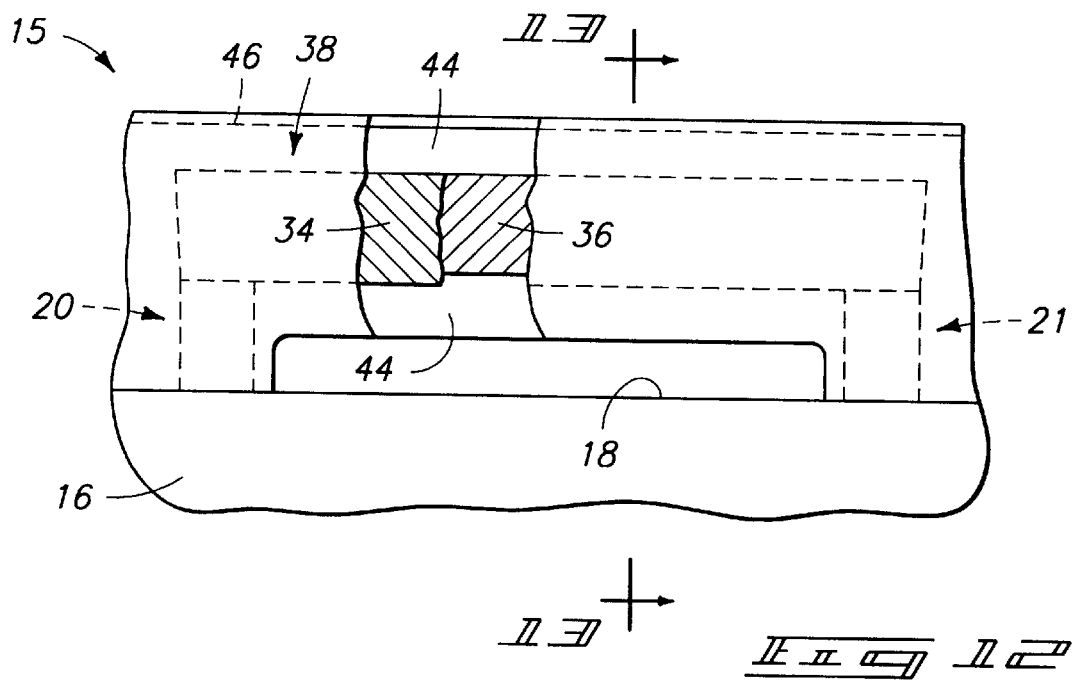
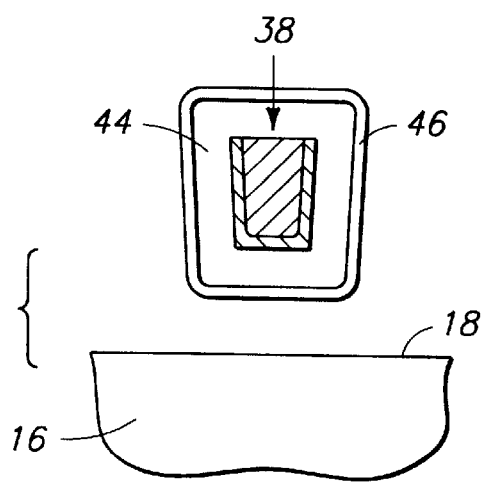

CONDUCTIVE LINES, COAXIAL LINES, INTEGRATED CIRCUITRY, AND METHODS OF FORMING CONDUCTIVE LINES, COAXIAL LINES, AND INTEGRATED CIRCUITRY

TECHNICAL FIELD

This invention relates to methods of forming conductive lines, such as co-axial lines, and to integrated circuitry incorporating conductive lines.

BACKGROUND OF THE INVENTION

As the density of integrated circuitry (IC) devices increases, continuing challenges are posed to find interconnect structures which are suitable for use with such densely-packed IC devices. For example, as clock cycles increase, interconnect structures which are capable of handling such clock cycles become necessary. Further, such interconnect structures must overcome concerns associated with signal propagation times, crosstalk, increased system noise and other spurious electrical effects which are detrimental to the performance of integrated circuits.

This invention arose out of concerns associated with providing integrated circuitry interconnect structures which are suitable for use with densely-packed, high-speed integrated circuitry devices.

SUMMARY OF THE INVENTION

Conductive lines, such as co-axial lines, integrated circuitry incorporating such conductive lines, and methods of forming the same are described. In one aspect, a substrate having an outer surface is provided. A masking material is formed over the outer surface and subsequently patterned to form a conductive line pattern. An inner conductive layer is formed within the conductive line pattern, followed by formation of a dielectric layer thereover and an outer conductive layer over the dielectric layer. Preferred implementations include forming the inner conductive layer through electroplating, or alternatively, electroless plating techniques. Other preferred implementations include forming the dielectric layer from suitable polymer materials having desired dielectric properties. A vapor-deposited dielectric layer of parylene is one such preferred dielectric material.

BRIEF DESCRIPTION OF THE DRAWINGS

Preferred embodiments of the invention are described below with reference to the following accompanying drawings.

FIG. 10 illustrates the semiconductor wafer fragment of FIG. 1 at a processing step subsequent to that of FIG. 9.

FIG. 11 illustrates the semiconductor wafer fragment of FIG. 1 at a processing step subsequent to that of FIG. 10.

FIG. 12 is a view taken along line 12—12 in FIG. 11.

FIG. 13 is a view taken along line 13—13 in FIG. 12.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
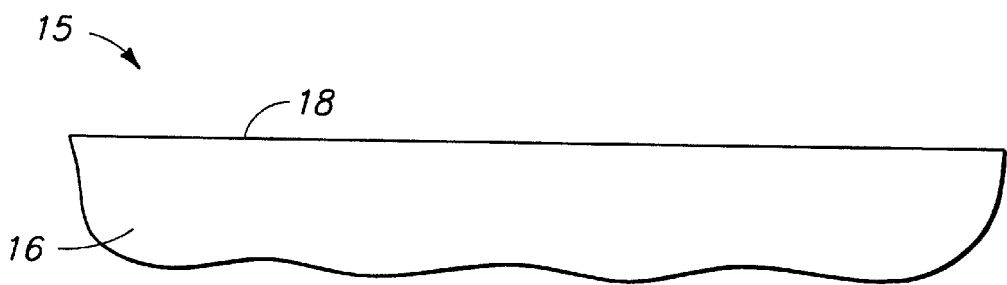
FIG. 1 illustrates a cross-sectional view of a semiconductor wafer fragment at a preliminary processing step according to the present invention.

Referring to FIG. 1, a semiconductor wafer fragment in process is indicated generally at 15, and includes a semiconductive substrate 16 having an outer surface 18. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 2:
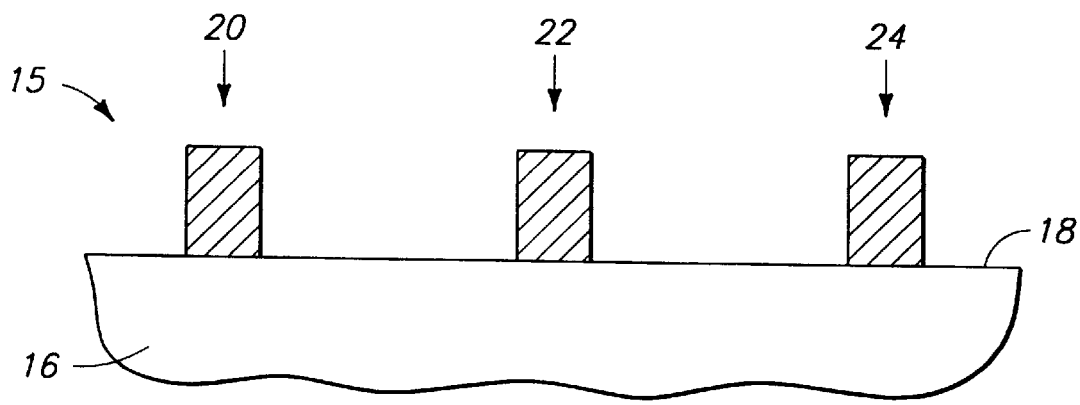
FIG. 2 illustrates the semiconductor wafer fragment of FIG. 1 at one processing step in accordance with one aspect of the invention subsequent to that of FIG. 1.

Referring to FIG. 2, conductive terminal members 20, 22, and 24 are formed over outer surface 18. Such constitute exemplary respective node locations with which electrical connection or communication is desired. In accordance with one aspect of the invention, other conductive terminal members are formed over the substrate and extend into and out of the plane of the page upon which FIG. 2 appears. Such other conductive terminal members can form, together with the illustrated terminal members, respective pairs of upstanding, spaced-apart terminal members. One such exemplary pair is shown in FIG. 12 at 20, 21 and discussed in more detail below.

Figure 3:
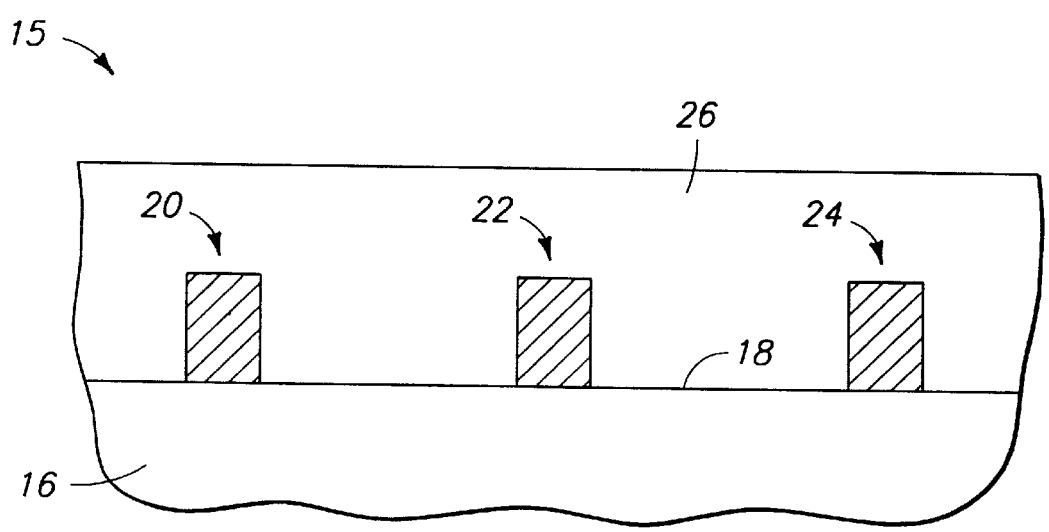
FIG. 3 illustrates the semiconductor wafer fragment of FIG. 1 at a processing step subsequent to that of FIG. 2.

Referring to FIG. 3, a first masking material layer 26 is formed over substrate 16 and the illustrated conductive terminal members. Accordingly, first layer 26 is formed over and between conductive terminal members which lie into and out of the plane of the page upon which FIG. 3 appears. An exemplary masking material is photoresist, although other masking materials can, of course, be used.

Figure 4:
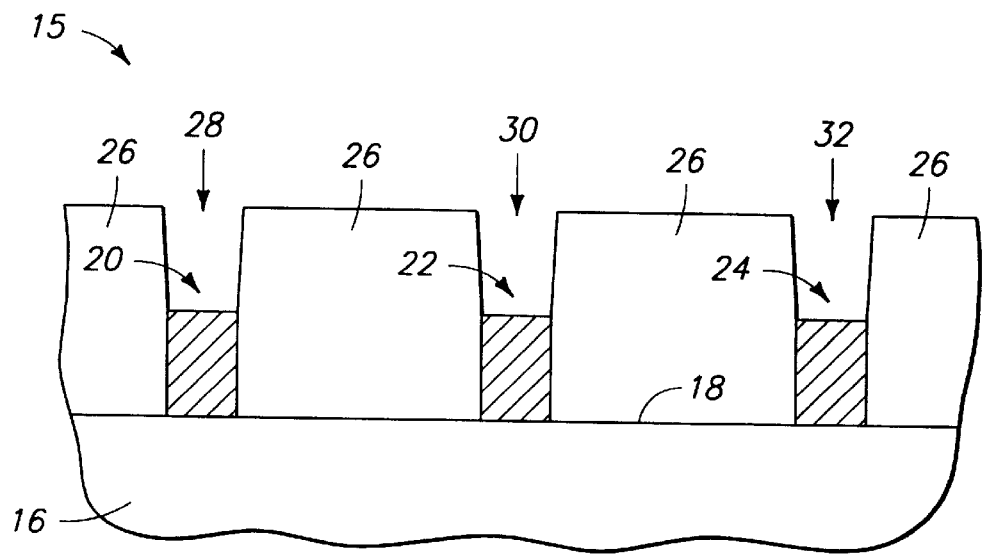
FIG. 4 illustrates the semiconductor wafer fragment of FIG. 1 at a processing step subsequent to that of FIG. 3.
Figure 5:
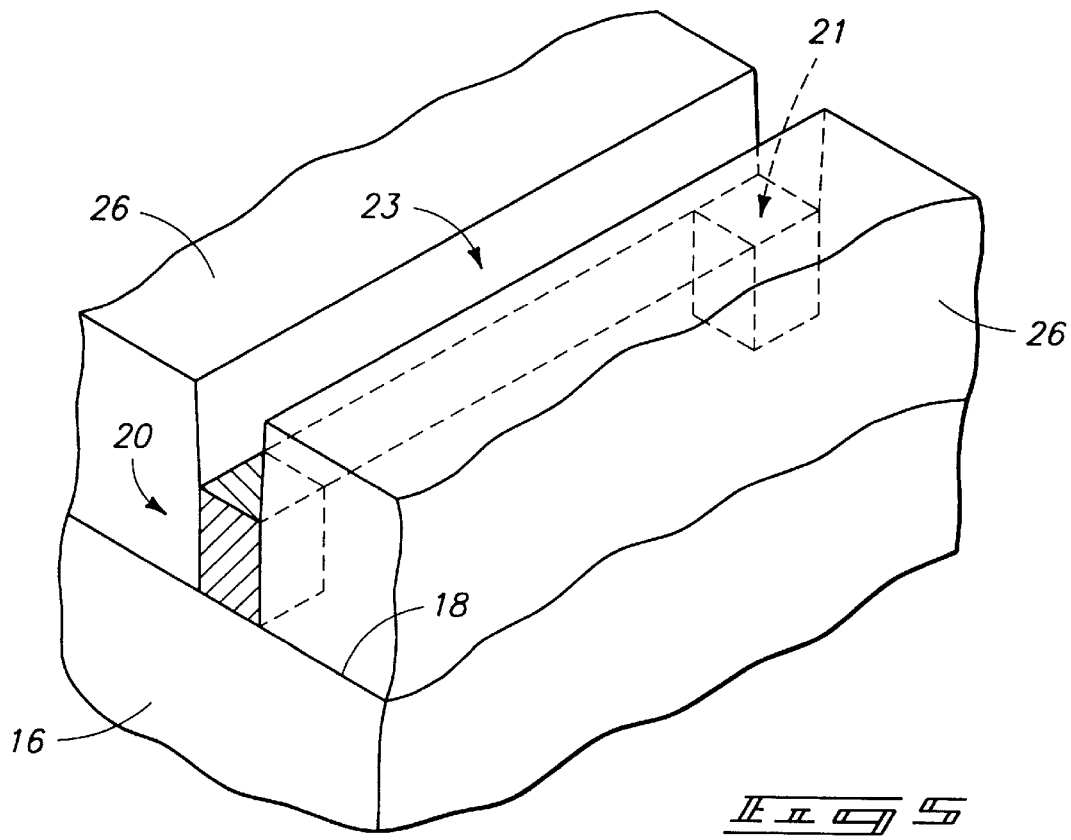
FIG. 5 is an isometric elevation of a portion of the semiconductor wafer fragment of FIG. 1 at the FIG. 4 processing step.

Referring to FIG. 4, first layer 26 is patterned over outer surface 18 to form at least one, and preferably a plurality, of conductive line patterns 28, 30, and 32. In one aspect, conductive line patterns 28, 30, and 32 expose at least portions of respective conductive terminal members 20, 22, and 24 and their respective mated terminal members which define the respective pairs of upstanding terminal members mentioned above. Ideally, and with reference to FIG. 5, this forms a trough 23 through first layer 26 which extends between and joins respective terminal member pairs such as exemplary pairs 20, 21. Yet, trough 23 does not extend to surface 18. Such can be accomplished by limiting the time of light exposure of the preferred photoresist of layer 26 such that only an outermost portion is light transformed for subsequent stripping. Alternately, where layer 26 constitutes another material such as $SiO_2$, the formation of a trough between the silicon pairs in a manner which avoids surface 18 exposure could be achieved with a masked timed etch. An etch stop layer might also be used. Regardless, the trough formation enables the spaced-apart conductive terminal members, such as terminal members 20, 21, to be electrically connected through the respective conductive line patterns, as will become apparent below.

Figure 6:
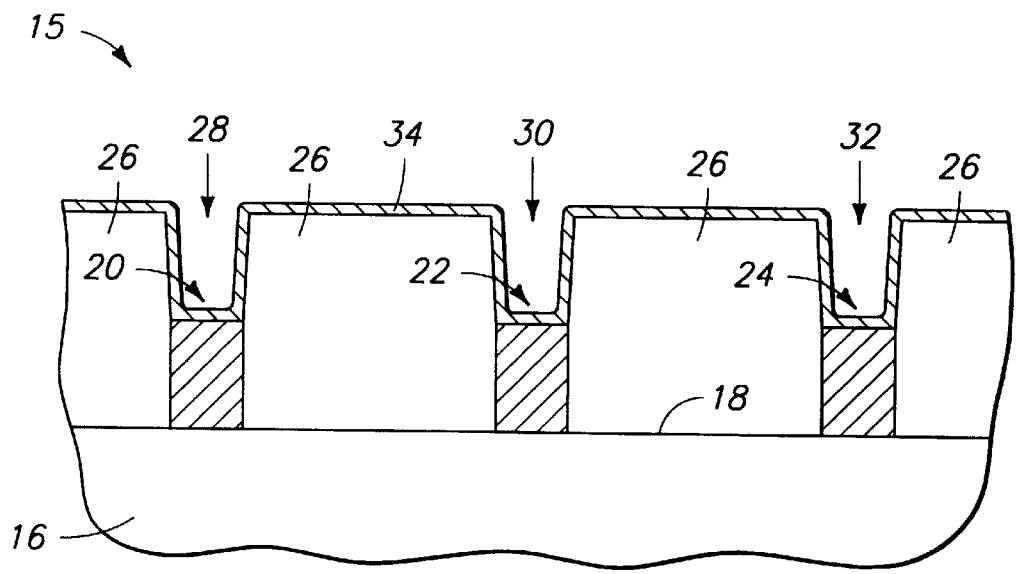
FIG. 6 illustrates the semiconductor wafer fragment of FIG. 1 at a processing step subsequent to that of FIG. 4, and in accordance with one embodiment of the present invention.

Referring to FIG. 6, and in accordance with a first preferred implementation, a first conductive layer 34 is formed over substrate 16 and within conductive line patterns 28, 30, and 32. Such layer can be formed through any suitable technique. An exemplary technique is sputtering or otherwise blanket-depositing layer 34 over the substrate. In a preferred aspect, the sputtering is conducted in connection with an ionized magnetron sputtering reactor in order to ensure adequate step coverage within the illustrated conductive line patterns. Typical and exemplary materials for layer 34 include a bi-layer comprising titanium and copper, or chromium and copper. Such layer is preferably deposited to a thickness from between about 100 to 200 nanometers. Such layer forms a so-called seed layer for an electroplating process as described below.

Figure 7:
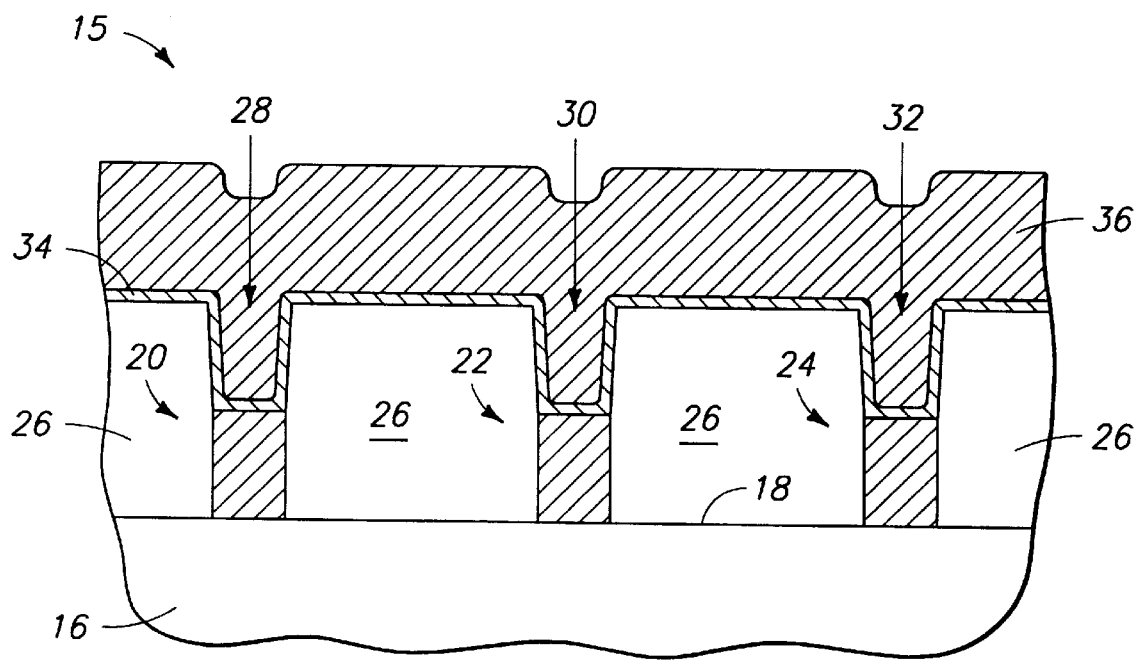
FIG. 7 illustrates the semiconductor wafer fragment of FIG. 1 at a processing step subsequent to that of FIG. 6.

Referring to FIG. 7, a second conductive layer 36 is formed over substrate 16, within conductive line patterns 28, 30, and 32, and over layer 34, preferably by electroplating techniques. Together, material of first layer 34 and second layer 36 will constitute an inner conductive layer or core of material which is formed within the line patterns. Exemplary materials for layer 36 include those materials which are suitable for use in electroplating processes, such as metal-comprising materials like copper and gold. Additionally, magnetic films comprising nickel, cobalt, and iron, and suitable alloys thereof can be used.

Figure 8:
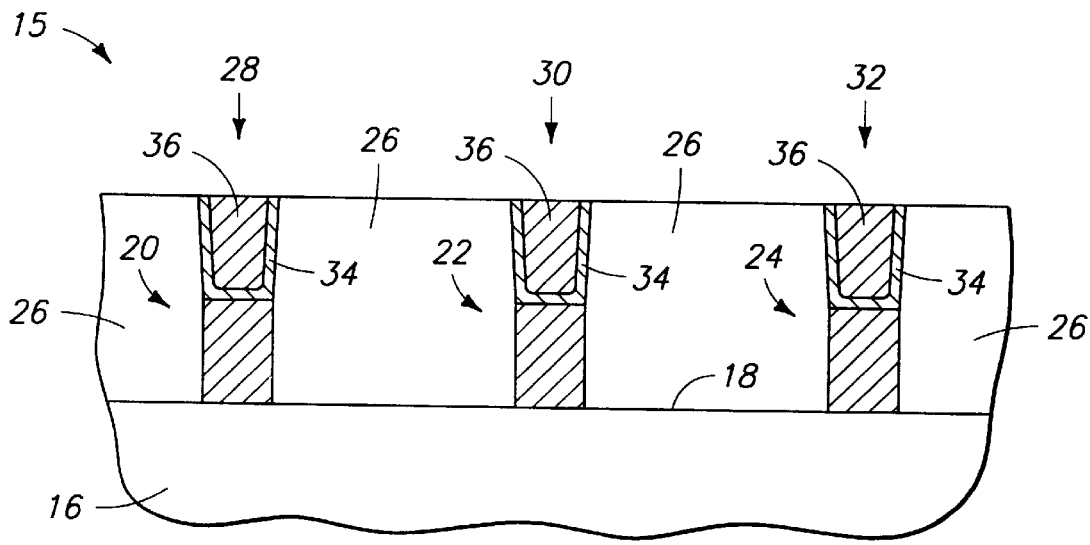
FIG. 8 illustrates the semiconductor wafer fragment of FIG. 1 at a processing step subsequent to that of FIG. 7.

Referring to FIG. 8, amounts of layers 34, 36 are removed to effectively electrically isolate conductive material within the respective conductive line patterns 28, 30, and 32. In a preferred aspect, the conductive material is planarized as by suitable chemical mechanical polishing thereof relative to masking layer 26. This forms individual inner conductive layers or cores which extend between and operably connect with individual terminal members of each respective pair.

In accordance with another preferred implementation, and one which follows from the FIG. 4 construction, the conductive material which is formed or provided within conductive line patterns 28, 30, and 32 can be formed through suitable known electroless plating techniques. Accordingly, only one layer of conductive material could be formed over the substrate and within the conductive line patterns. Processing in accordance with this implementation, after the formation of the conductive material layer, would otherwise take place substantially as described herein with respect to the first implementation.

Figure 9:
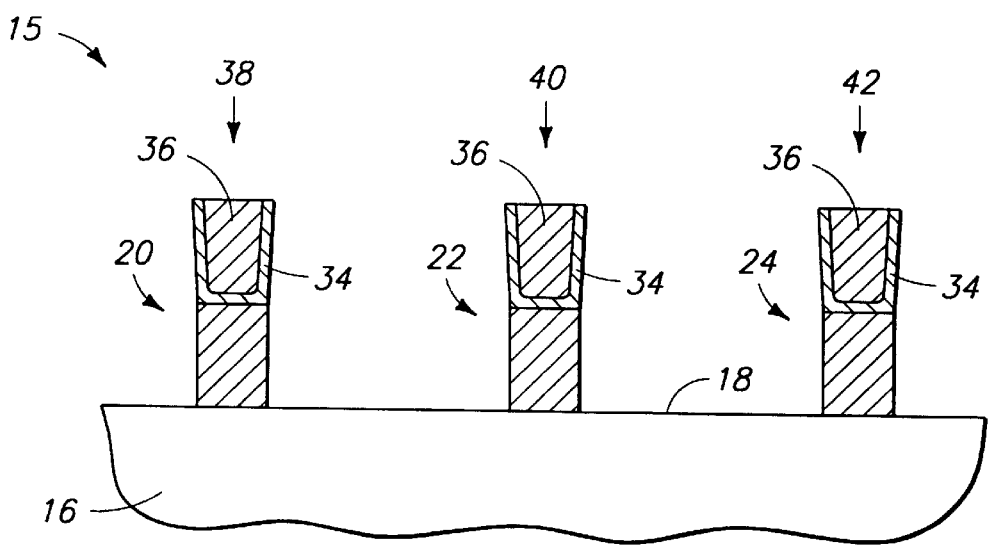
FIG. 9 illustrates the semiconductor wafer fragment of FIG. 1 at a processing step subsequent to that of FIG. 8.

Referring to FIGS. 9 and 12, masking material 26 is removed from at least around conductive material portions which extend between respective spaced-apart conductive terminal members, such as pair 20, 21 of FIG. 12. The conductive material portions comprise conductive lines 38, 40, and 42 which include other portions which are supported above, spaced from, or otherwise suspended over substrate outer surface 18 by the respective terminal members 20, 22, and 24. Accordingly, masking material is removed from elevationally below the conductive material portions which extend between the terminal members, thereby leaving such portions supported above the underlying substrate outer surface 18. Masking material 26 can be removed through any suitable technique such as oxygen plasma etching.

Referring to FIG. 10, a dielectric layer 44 is formed over substrate 16 and at least some of the inner conductive layers comprising respective conductive lines 38, 40, and 42. Preferably, layer 44 comprises a dielectric polymer layer which is formed over and surrounds at least the respective portions of conductive lines 38, 40, and 42 which are spaced from outer surface 18 and extend between the terminal members. An example material is parylene. Parylene desirably has a lower dielectric constant, e.g. 2.6, as compared with dielectric constants of other materials such as $SiO_2$ which can have dielectric constants from between 3.9 to 4.2. Such accommodates operating parameters of high speed integrated circuitry by increasing signal propagation (decreasing propagation times) and reducing interline coupling or crosstalk. The preferred parylene material is preferably vapor phase deposited over the substrate and the respective conductive lines. Parylene and processing techniques which utilize parylene are described in more detail in an article entitled "Low and High Dielectric Constant Thin Films for Integrated Circuit Applications", authored by Guttman et al., and presented to the Advanced Metallization and Interconnect Systems for VLSI Applications in 1996, held in Boston, Massachusetts, Oct. 3–5, 1996, and published in May/June 1997 by Material Research Society of Pittsburgh, Pa.

Preferably, dielectric layer 44 surrounds a substantial portion of the conductive material which constitutes conductive lines 38, 40, and 42. In accordance with one aspect of the invention, the substantial portion of such material constitutes that portion of material which is suspended above outer surface 18. Such is more easily seen when FIGS. 10 and 12 are viewed together.

Referring to FIG. 11, an outer conductive sheath 46 is formed over dielectric layer 44. Preferably, conductive sheath 46 constitutes a metal-comprising layer of material formed by chemical vapor deposition. Aluminum is an example preferred material. Layer 46 forms a coaxial outer conductive line component which is formed over dielectric layer 44.

Referring to FIGS. 12 and 13, an exemplary upstanding pair of conductive terminal members 20, 21 (FIG. 12) are shown which illustrate a portion of conductive line 38 which is suspended above substrate outer surface 18. A portion of FIG. 12 has been broken away for clarity.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming a co-axial line comprising:
   positioning a substrate for processing thereupon, the substrate having an outer surface;
   processing the substrate by forming a conductive line at least a portion of which is elevationally spaced from the outer surface to leave some void space between the line and the outer surface;
   processing the substrate by forming a dielectric polymer layer over and surrounding at least a portion of the conductive line where it is spaced from the outer surface while some void space is present between the line and the outer surface and to leave some void space between the polymer layer over the line and the outer surface; and processing the substrate by forming an outer conductive sheath over the dielectric polymer layer while some void space is present between the polymer layer over the line and the outer surface, the outer conductive sheath leaving some void space between the outer conductive sheath and the outer surface, the outer conductive sheath being formed over the dielectric polymer layer but not over the substrate outer surface.

2. A method of forming a co-axial line comprising:

providing a substrate having an outer surface;

forming a conductive line at least a portion of which is elevationally spaced from the outer surface to leave some void space between the line and the outer surface;

forming a dielectric polymer layer over and surrounding at least a portion of the conductive line where it is spaced from the outer surface while some void space is present between the line and the outer surface and to leave some void space between the polymer layer over the line and the outer surface; and forming an outer conductive sheath over the dielectric polymer layer, the forming of the outer conductive sheath comprising chemical vapor depositing a metal-comprising layer of material over the dielectric polymer layer while some void space is present between the polymer layer over the line and the outer surface, the outer conductive sheath leaving some void space between the outer conductive sheath and the outer surface, the outer conductive sheath being formed over the dielectric polymer layer but not over the substrate outer surface.

3. The method of claim 2, wherein forming an outer conductive sheath comprises forming the outer conductive sheath using aluminum.

4. The method of claim 1, wherein forming a dielectric polymer layer comprises forming the dielectric polymer layer to include parylene.

5. A method of forming a co-axial line comprising:

providing a substrate having an outer surface;

forming a conductive line at least a portion of which is elevationally spaced from the outer surface to leave some void space between the line and the outer surface;

forming a dielectric polymer layer over and surrounding at least a portion of the conductive line where it is spaced from the outer surface while some void space is present between the line and the outer surface and to leave some void space between the polymer layer over the line and the outer surface;

forming an outer conductive sheath over the dielectric polymer layer while some void space is present between the polymer layer over the line and the outer surface, the outer conductive sheath leaving some void space between the outer conductive sheath and the outer surface, the outer conductive sheath being formed over the dielectric polymer layer but not over the substrate outer surface; and the forming of the conductive line comprising:

forming a conductive line pattern over the substrate outer surface;

forming conductive material over and within the conductive line pattern; and removing the conductive line pattern from between the conductive material and the outer surface.

6. The method of claim 5, wherein the forming of the conductive material comprises:

forming a conductive film layer over the conductive line pattern; and electroplating conductive material over the conductive film layer.

7. The method of claim 5, wherein the forming of the conductive material comprises electroless plating a conductive material over the conductive line pattern.

8. A method of forming a co-axial line comprising:

forming a masking material layer over a substrate;

patterning the masking material layer to form at least one conductive line pattern;

forming an inner conductive layer within the at least one conductive line pattern;

removing the masking material from the substrate and from between the substrate and the inner conductive layer to form some void space between the inner conductive layer and the substrate;

vapor depositing a layer comprising a polymer dielectric material over at least some of the inner conductive layer while some void space is present between the line and the outer surface and to leave some void space between the polymer layer over the line and the substrate; and forming an outer conductive layer over the polymer dielectric material while some void space is present between the polymer layer over the line and the substrate, the outer conductive sheath leaving some void space between the outer conductive sheath and the substrate, the outer conductive layer being formed over the dielectric polymer material but not over an outer surface of the substrate.

9. The method of claim 8, wherein the forming of the inner conductive layer comprises:

sputtering a conductive film layer over the conductive line pattern; and electroplating a conductive material over the conductive film layer.

10. The method of claim 8, wherein the forming of the inner conductive layer comprises electroless plating a conductive material over the conductive line pattern.

11. The method of claim 8, wherein the patterning comprises forming a plurality of conductive line patterns.

12. The method of claim 11, further comprising, after forming the inner conductive layer, planarizing the inner conductive layer relative to the masking material layer.

13. A method of forming a co-axial line comprising:

forming a pair of upstanding, spaced-apart conductive terminal members over a substrate;

forming a co-axial inner conductive line component which extends between and electrically connects with the terminal members, the co-axial inner conductive line component being suspended above a surface of the substrate by the terminal members;

surrounding the suspended inner conductive line component with a dielectric polymer layer; and forming a co-axial outer conductive line component over the dielectric polymer layer while some void space is present between the polymer layer over the line and the substrate, the outer conductive line component leaving some void space between the outer conductive line component and the substrate, the outer conductive line component being formed over the dielectric polymer layer but not over an outer surface of the substrate.

14. The method of claim 13 further comprising forming a masking material trough which extends between exposed portions of the terminal members, at least a portion of the inner conductive line component being formed within the trough.

15. The method of claim 13, wherein the forming of the co-axial inner conductive line component comprises:
   forming a masking material over the substrate;
   patterning the masking material to form a conductive line pattern which exposes at least some of the conductive terminal members; and
   electrically connecting selected exposed portions of the conductive terminal members through the conductive line pattern.

16. The method of claim 15, wherein the electrically connecting comprises electroplating conductive material at least within the conductive line pattern.

17. The method of claim 15, wherein the electrically connecting comprises electroless plating a conductive material at least within the conductive line pattern.

18. The method of claim 13, wherein surrounding comprises surrounding the suspended inner conductive line component with parylene.

19. The method of claim 13, wherein the forming of the co-axial outer conductive line component comprises chemical vapor depositing a metal-comprising layer over the dielectric polymer layer.

20. The method of claim 13, wherein the forming of the co-axial outer conductive line component comprises electroless plating the line component over the dielectric polymer layer.

21. A method of forming a co-axial line comprising:
   forming a pair of upstanding, spaced-apart terminal members over a substrate;
   forming photoresist over the terminal members;
   forming a line pattern within the photoresist which exposes and extends between the terminal members, the photoresist covering the substrate beneath the line pattern;
   sputtering a first conductive layer of material over the co-axial line pattern;
   electroplating a second conductive material over the first conductive layer to provide an inner conductor;
   removing the photoresist to suspend the inner conductor between terminal members above the substrate;
   forming a dielectric layer over and surrounding the suspended inner conductor; and
   forming an outer conductive sheath of material over the dielectric layer while some void space is present between the dielectric layer and the substrate, the outer conductive sheath leaving some void space between the outer conductive sheath and the substrate, the outer conductive sheath being formed over the dielectric layer but not over an outer surface of the substrate.

22. The method of claim 21, wherein the sputtering of the first conductive layer comprises ionized magnetron sputtering of the first conductive layer.

23. The method of claim 21, wherein the forming of the dielectric layer comprises forming a polymer layer over the suspended inner conductor.

24. The method of claim 21, further comprising, after the electroplating of the second conductive material planarizing the second conductive material relative to the photoresist.

25. A method of forming a co-axial line comprising:
   forming a pair of upstanding, spaced-apart terminal members over a substrate;
   forming photoresist over the terminal members;
   forming a line pattern within the photoresist which exposes and extends between the terminal members, the photoresist covering the substrate beneath the line pattern;
   electroless plating a conductive material over the line pattern;
   removing photoresist from the substrate, including from between the conductive material and the substrate to suspend the conductive material between terminal members;
   forming a dielectric layer surrounding the suspended conductive material; and
   forming an outer conductive sheath of material over the dielectric layer while some void space is present between the dielectric layer over the line and the substrate, the outer conductive sheath leaving some void space between the outer conductive sheath and the substrate, the outer conductive sheath being formed over the dielectric layer but not over an outer surface of the substrate.

26. The method of claim 25, wherein the forming of the dielectric layer comprises forming a polymer layer over the electroless-plated conductive material.

27. The method of claim 25, further comprising, after the electroless plating of the conductive material, planarizing the electroless-plated conductive material relative to the photoresist.

28. A method of forming a co-axial line comprising:
   providing a substrate having an outer surface;
   forming a pair of upstanding, spaced-apart conductive terminal members over the substrate outer surface;
   forming a layer of photoresist over the substrate outer surface;
   forming a conductive line pattern in the photoresist, the conductive line pattern extending between and exposing portions of the conductive terminal members, the photoresist covering the outer surface beneath the line pattern;
   forming a layer of conductive material over the substrate and within the conductive line pattern;
   removing a sufficient amount of material of the layer of conductive material to electrically isolate the conductive material within the conductive line pattern;
   removing photoresist from at least around a conductive material portion which extends between the spaced-apart conductive terminal members, the removing of the photoresist suspending the conductive material portion above the outer surface;
   vapor depositing parylene and completely surrounding the suspended conductive material extending between the spaced-apart conductive terminal members; and
   vapor depositing a conductive material over the parylene surrounding the suspended conductive material extending between the spaced-apart conductive terminal members while some void space is present between the parylene over the suspended conductive material and the outer surface, the vapor-deposited conductive material leaving some void space between the vapor-deposited conductive material and the outer surface, the conductive material being formed over the parylene but not over the substrate outer surface.

29. The method of claim 1, wherein forming an outer conductive sheath comprises forming the outer conductive sheath using aluminum.

30. The method of claim 1, wherein processing the substrate by forming a conductive line comprises forming the conductive line using a material chosen from a group consisting of: nickel, cobalt and iron.

31. The method of claim 1, wherein:

forming an outer conductive sheath comprises forming the outer conductive sheath using aluminum; and forming a dielectric polymer layer comprises forming the dielectric polymer layer using parylene.

32. The method of claim 2, wherein forming a dielectric polymer layer comprises forming the dielectric polymer layer using parylene.

33. The method of claim 2, wherein processing the substrate by forming a conductive line comprises forming the conductive line using a material chosen from a group consisting of: nickel, cobalt and iron.

34. The method of claim 2, wherein:

forming an outer conductive sheath comprises forming the outer conductive sheath using aluminum; and forming a dielectric polymer layer comprises forming the dielectric polymer layer using parylene.

35. The method of claim 5, wherein forming an outer conductive sheath comprises forming the outer conductive sheath using aluminum.

36. The method of claim 5, wherein processing the substrate by forming a conductive line comprises forming the conductive line using a material chosen from a group consisting of: nickel, cobalt and iron.

37. The method of claim 5, wherein forming a dielectric polymer layer comprises forming the dielectric polymer layer using parylene.

38. The method of claim 5, wherein:

forming an outer conductive sheath comprises forming the outer conductive sheath using aluminum; and forming a dielectric polymer layer comprises forming the dielectric polymer layer using parylene.

\* \* \* \* \*